United States Patent
Dhanekula et al.

(10) Patent No.: US 8,244,493 B2
(45) Date of Patent: Aug. 14, 2012

(54) NOISE REDUCTION TECHNIQUE FOR MONITORING ELECTROMAGNETIC SIGNALS

(75) Inventors: Ramakrishna C. Dhanekula, San Diego, CA (US); Kenny C. Gross, San Diego, CA (US); Andrew J. Lewis, Litchfield, NH (US)

(73) Assignee: Oracle America, Inc., Redwood Shores, CA (US)

( * ) Notice: Subject to any disclaimer, the term of this patent is extended or adjusted under 35 U.S.C. 154(b) by 504 days.

(21) Appl. No.: 12/494,709

(22) Filed: Jun. 30, 2009

(65) Prior Publication Data
US 2010/0332199 A1 Dec. 30, 2010

(51) Int. Cl.
*G01R 23/00* (2006.01)
(52) U.S. Cl. .......................................... 702/75
(58) Field of Classification Search .............. 702/58, 702/69, 75, 111, 179, 181, 183, 185, 188, 702/191, 193–195, 199; 375/350
See application file for complete search history.

(56) References Cited

U.S. PATENT DOCUMENTS
2007/0217554 A1* 9/2007 Wetzker ........................ 375/350
* cited by examiner

*Primary Examiner* — Mohamed Charioui
(74) *Attorney, Agent, or Firm* — Park, Vaughan, Fleming & Dowler LLP; Chia-Hsin Suen

(57) ABSTRACT

One embodiment provides a system that analyzes a target electromagnetic signal radiating from a monitored system. During operation, the system monitors the target electromagnetic signal using a set of antennas to obtain a set of received target electromagnetic signals from the monitored system. Next, the system calculates a weighted mean of the received target electromagnetic signals using a first pattern-recognition model. The system then subtracts the received target electromagnetic signals from the weighted mean of the received target electromagnetic signals to obtain a set of noise-reduced signals for the monitored system. Finally, the system assesses the integrity of the monitored system by analyzing the noise-reduced signals using a second pattern-recognition model.

20 Claims, 7 Drawing Sheets

NOISE REDUCTION TECHNIQUE FOR MONITORING ELECTROMAGNETIC SIGNALS

RELATED APPLICATION

The subject matter of this application is related to the subject matter in a co-pending non-provisional application by inventors Andrew J. Lewis, Kenny C. Gross, Aleksey M. Urmanov, and Ramakrishna C. Dhanekula and filed 31 Jan. 2008, entitled "Characterizing a Computer System Using Radiating Electromagnetic Signals Monitored Through an Interface," having Ser. No. 12/177,724. The subject matter of this application is also related to the subject matter in a co-pending non-provisional application by inventors Kenny C. Gross, Robert P. Masleid, Ramakrishna C. Dhanekula, and David K. McElfresh, entitled "Near-Isotropic Antenna for Monitoring Electromagnetic Signals," having Ser. No. 12/474,486, and filing date 29 May 2009.

BACKGROUND

1. Field

The present embodiments relate to techniques for monitoring and analyzing computer systems. More specifically, the present embodiments relate to a method and system for reducing ambient-noise in a target electromagnetic signal from a monitored computer system.

2. Related Art

Electromagnetic signals radiated by computer systems and/or other electronic systems can be used to characterize operating parameters of the electronic systems. For example, a number of antennas may be positioned in the vicinity of a computer system to receive electromagnetic signals from the computer system. The electromagnetic signals may then be analyzed using nonlinear, nonparametric (NLNP) regression techniques to detect degradation and other anomalies in the electronic systems.

However, the sensitivity of NLNP regression techniques may be limited by dynamic background ambient-noise in the signals received by the antennas. For example, electromagnetic signals collected from a computer system in a data center may be affected by electromagnetic noise generated by other computer systems in the data center. Decreased sensitivity caused by this electromagnetic noise may result in the missed detection of subtle anomalies, an increase in the incidence of false alarms, and/or other inaccuracies in the analysis of the electromagnetic signals.

Hence, what is needed is a mechanism for reducing ambient-noise in electromagnetic signals received from monitored electronic systems.

SUMMARY

One embodiment of the present invention provides a system that analyzes a target electromagnetic signal radiating from a monitored system. During operation, the system monitors the target electromagnetic signal using a set of antennas to obtain a set of received target electromagnetic signals from the monitored system. Next, the system calculates a weighted mean of the received target electromagnetic signals using a first pattern-recognition model. The system then subtracts the received target electromagnetic signals from the weighted mean of the received target electromagnetic signals to obtain a set of noise-reduced signals for the monitored system. Finally, the system assesses the integrity of the monitored system by analyzing the noise-reduced signals using a second pattern-recognition model.

In some embodiments, the first pattern-recognition model and second pattern-recognition model are created using a nonlinear, nonparametric regression technique.

In some embodiments, the first pattern-recognition model is created by:
  (i) monitoring a reference electromagnetic signal radiating from the monitored system using a set of reference antennas to obtain a set of received reference electromagnetic signals;
  (ii) generating a set of frequency-domain representations of the received reference electromagnetic signals;
  (iii) dividing each of the frequency-domain representations of the received reference electromagnetic signals into a set of frequencies;
  (iv) selecting a set of well-correlated frequencies from the frequency-domain representations of the received reference electromagnetic signals;
  (v) constructing a set of reference electromagnetic-signal amplitude-time series for each of the well-correlated frequencies based on the received reference electromagnetic signals collected over a first predetermined time period; and
  (vi) training the first pattern-recognition model using the reference electromagnetic-signal amplitude-time series.

In some embodiments, the second pattern-recognition model is created by:
  (i) calculating a weighted mean of the received reference electromagnetic signals obtained from the reference antennas using the first pattern-recognition model;
  (ii) subtracting the received reference electromagnetic signals from the weighted mean of the received reference electromagnetic signals to obtain a set of reference noise-reduced signals for the monitored system;
  (iii) constructing a set of reference electromagnetic-signal fingerprints for each of the well-correlated frequencies from the reference noise-reduced signals obtained over a second predetermined time period; and
  (iv) training the second pattern-recognition model using the reference electromagnetic-signal fingerprints.

In some embodiments, calculating the weighted mean of the received target electromagnetic signals involves:
  for each frequency from the frequencies of each of the received target electromagnetic signals,
    (i) determining a standard deviation of the frequency using the first pattern-recognition model;
    (ii) calculating a weight for the frequency, wherein the weight is inversely proportional to the standard deviation of the frequency;
    (iii) multiplying a monitored amplitude-time series of the frequency with the weight to obtain a weighted amplitude-time series for the frequency; and
    (iv) using the weighted amplitude-time series to calculate an average amplitude-time series for the frequency.

In some embodiments, obtaining the noise-reduced signals for the monitored system involves:
  for each frequency from the frequencies of each of the received target electromagnetic signals, subtracting the received target electromagnetic signals from the average amplitude-time series to obtain a noise-reduced amplitude-time series.

In some embodiments, analyzing the noise-reduced signals using the second pattern-recognition model involves:
  (i) generating a target electromagnetic-signal fingerprint from the noise-reduced signals;

(ii) feeding the target electromagnetic-signal fingerprint into the second pattern-recognition model;
(iii) producing an estimated electromagnetic-signal fingerprint using the second pattern-recognition model; and
(iv) comparing the target electromagnetic-signal fingerprint to the estimated electromagnetic-signal fingerprint to detect a statistical deviation in the noise-reduced signals.

In some embodiments, the statistical deviation is detected using a sequential probability ratio test (SPRT).

In some embodiments, the antennas include at least one of a near-isotropic antenna and a Universal Serial Bus (USB) interface.

BRIEF DESCRIPTION OF THE FIGURES

In the figures, like reference numerals refer to the same figure elements.

DETAILED DESCRIPTION

Figure 1:
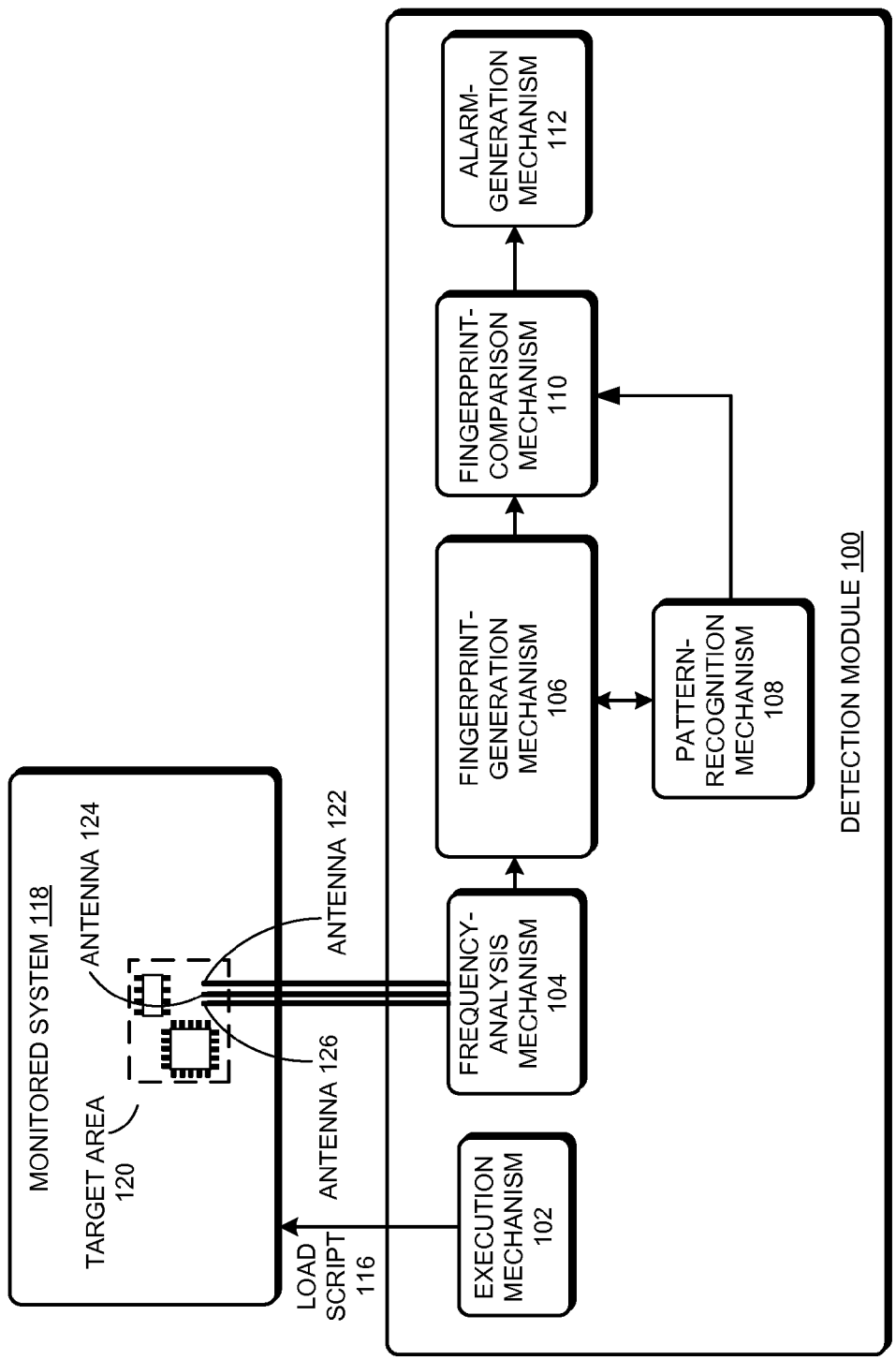
FIG. 1 shows a system that analyzes a target electromagnetic signal radiating from a monitored system in accordance with an embodiment.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing instructions and/or data now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Embodiments provide a method and system for monitoring a target electromagnetic signal radiating from a monitored system. The monitored system may correspond to an electronic system such as a computer system, a medical electronic system, a consumer electronic system (e.g., television, stereo, game console, etc.), and/or an aerospace electronic system. A set of antennas may be used to monitor the target electromagnetic signal from one or more components of the monitored system. The antennas may include Universal Serial Bus (USB) interfaces and/or near-isotropic antennas. The target electromagnetic signal may then be analyzed to assess the integrity of the monitored system.

More specifically, embodiments provide a method and system for reducing ambient-noise in the target electromagnetic signal. The target electromagnetic signal may be obtained by the antennas as a set of received target electromagnetic signals from the monitored system. A weighted mean of the received target electromagnetic signals may then be calculated using a first pattern-recognition model. The weighted mean may be used to determine the level of ambient-noise in the target electromagnetic signal as received by the antennas. In particular, each received target electromagnetic signal may contribute to the weighted mean according to the standard deviation of the received target electromagnetic signal; a higher contribution is made with a received target electromagnetic signal containing a lower standard deviation (e.g., less ambient-noise).

The received target electromagnetic signals may then be subtracted from the weighted mean to obtain a set of noise-reduced signals. Because the weighted mean includes greater contributions from signals with less perturbation (e.g., noise), the subtraction of signals with higher perturbation from the weighted mean may effectively detune the noisier signals from analysis. The noise-reduced signals may then be analyzed using a second pattern-recognition model to assess the integrity of the monitored system.

FIG. 1 shows a system (including detection module 100) that analyzes a target electromagnetic signal radiating from a monitored system 118 in accordance with an embodiment. The system may be used to characterize a monitored system 118, such as a computer system, a consumer electronics device, an aerospace electronic system, a medical electronic system, and/or another system that includes electronic components. In particular, the system of FIG. 1 may be used to characterize monitored system 118 by monitoring and analyzing a target electromagnetic signal radiating from monitored system 118.

Execution mechanism 102 causes load script 116 to run on computer system 118. Frequency-analysis mechanism 104 is coupled to a set of antennas 122-126 and fingerprint-generation mechanism 106. Fingerprint-generation mechanism 106 is coupled to pattern-recognition mechanism 108 and fingerprint-comparison mechanism 110. Pattern-recognition mechanism 108 is coupled to fingerprint-comparison mechanism 110, and fingerprint-comparison mechanism 110 is coupled to alarm-generation mechanism 112.

Frequency-analysis mechanism 104, fingerprint-generation mechanism 106, pattern-recognition mechanism 108, fingerprint-comparison mechanism 110, and alarm-generation mechanism 112 may each be implemented in any combination of hardware and software. In one or more embodiments, one or more of these mechanisms operates on monitored system 118. For example, one or more of these mechanisms may operate on one or more service processors, central processing units (CPUs), microprocessors, microcontrollers, and/or programmable-logic controllers (PLCs) on monitored system 118. As a result, one or more of these mechanisms may be located inside monitored system 118. Alternatively, one or more of these mechanisms may operate on a separate system, such as a computer system operatively connected to monitored system 118 through an interface and/or network connection.

Target area 120 may correspond to any area of monitored system 118 that radiates electromagnetic signals. In one or more embodiments, target area 120 includes one or more semiconductor circuits, devices, electromechanical devices, printed circuit boards, and/or other electronic components that emit electromagnetic signals. For example, target area 120 may include all of monitored system 118. Target area 120 may also correspond to multiple target areas in one or more monitored systems.

Antennas 122-126 may be coupled to frequency-analysis mechanism 104 and positioned to receive electromagnetic signals from target area 120. In one or more embodiments, antennas 122-126 correspond to an insulated wire with a fixed length of the insulation stripped off. In some of these embodiments, the stripped end of the insulated wire is open to free space and the other end of the wire is coupled to frequency-analysis mechanism 104. In one embodiment of the present invention, the stripped length is approximately ½ inch. In another embodiment of the present invention, the length of the antenna can be selected to achieve optimal discrimination sensitivity and robustness. Note that while many types of antennas can be used to collect electromagnetic signals, stripped wire provides a simple and inexpensive option.

Antennas 122-126 may also include: a dipole antenna, a Yagi-Uda antenna, a loop antenna, an electrical short antenna (e.g., an open-ended wire having a length less than a quarter wavelength), a fractal antenna, a parabolic antenna, a microstrip antenna, a quad antenna, a random wire antenna (e.g., an open-ended wire having a length greater than one wavelength), a beverage antenna, a helical antenna, a phased array antenna, and/or any other type of antenna now known or later developed.

In one or more embodiments, antennas 122-126 include Universal Serial Bus (USB) interfaces and/or near-isotropic antennas. Monitoring of target electromagnetic signals using USB interfaces is described in a co-pending non-provisional application by inventors Andrew J. Lewis, Kenny C. Gross, Aleksey M. Urmanov, and Ramakrishna C. Dhanekula, entitled "Characterizing a Computer System Using Radiating Electromagnetic Signals Monitored Through an Interface," having Ser. No. 12/177,724 and filed 31 Jan. 2008, which is incorporated herein by reference. Near-isotropic antennas for monitoring electromagnetic signals are described in a co-pending non-provisional application by inventors Kenny C. Gross, Robert P. Masleid, Ramakrishna C. Dhanekula, and David K. McElfresh, entitled "Near-Isotropic Antenna for Monitoring Electromagnetic Signals," having Ser. No. 12/474,486, a nd filing date May 29, 2009, which is incorporated herein by reference.

In one or more embodiments, antennas 122-126 are placed at a fixed position inside monitored system 118. For example, antennas 122-126 may be placed in a predetermined position in monitored system 118 during manufacturing or assembly of monitored system 118. Furthermore, antennas 122-126 may be placed in a predetermined relationship with respect to one or more components or areas inside monitored system 118. For example, to receive electromagnetic signals from a processor in monitored system 118, antennas 122-126 may be placed near the processor. The orientation of the antennas can be based on properties of the electromagnetic signals which are desired to be received, including but not limited to one or more of the following: the polarization and signal strength of the electromagnetic signals to be detected; and the polarization and strength of other electromagnetic signals generated by computer system 118 or other devices.

In one or more embodiments, antennas 122-126 are inserted into monitored system 118 through an opening in the chassis. Antennas 122-126 may also be moved to a predetermined number of pre-specified locations within monitored system 118 to detect electromagnetic signals at each location.

On the other hand, antennas 122-126 may be placed outside monitored system 118. Furthermore, antennas 122-126 may be positioned in close proximity to monitored system 118 or at a distance from monitored system 118. In one or more embodiments, better sensitivity and, hence, higher signal-to-noise ratio (SNR) may be achieved by placing antennas 122-126 closer to monitored system 118 and/or near specific components or areas of monitored system 118. As described below, detection module 100 may also employ analytical noise-reduction techniques to improve the signal-to-noise ratio in monitoring electromagnetic signals radiating from monitored system 118.

In one or more embodiments, antennas 122-126 are held in a fixed orientation with respect to monitored system 118 or the component in monitored system 118 from which the electromagnetic radiation is to be detected. To hold antennas 122-126 in the fixed orientation, antennas 122-126 may be physically attached to a portion of monitored system 118 or a component inside monitored system 118. For example, antennas 122-126 may be physically attached to a printed circuit board in monitored system 118. Furthermore, antennas 122-126 may be integrated into a component (e.g., USB interface) in monitored system 118.

The electromagnetic signals detected by antennas 122-126 may be used by an analysis apparatus (e.g., detection module 100) to characterize monitored system 118. In particular, the analysis apparatus may analyze a target electromagnetic signal monitored by antennas 122-126 to assess the integrity of monitored system 118. To assess the integrity of monitored system 118, the analysis apparatus may characterize parameters such as a model or manufacturer, the authenticity of a component, modifications made to a component, the presence and length of metal whiskers, a physical variable, a fault, a prognostic variable, a health metric, and/or other parameters that affect electromagnetic signals radiated from monitored system 118.

Furthermore, the analysis techniques that may be used by the analysis apparatus to analyze the target electromagnetic signal obtained from antennas 122-126 are discussed in the following: U.S. patent application entitled "Using EMI Signals to Facilitate Proactive Fault Monitoring in Computer Systems," by Kenny C. Gross, Aleksey M. Urmanov, Ramakrishna C. Dhanekula and Steven F. Zwinger, application Ser. No. 11/787,003, filed 12 Apr. 2007, which is hereby fully incorporated by reference; U.S. patent application entitled "Method and Apparatus for Generating an EMI Fingerprint for a Computer System," by Kenny C. Gross, Aleksey M. Urmanov, and Ramakrishna C. Dhanekula, application Ser. No. 11/787,027, filed 12 Apr. 2007, which is hereby fully incorporated by reference; U.S. patent application entitled "Accurately Inferring Physical Variable Values Associated with Operation of a Computer System," by Ramakrishna C. Dhanekula, Kenny C. Gross, and Aleksey M. Urmanov, application Ser. No. 12/001,369, filed 10 Dec. 2007, which is hereby fully incorporated by reference; U.S. patent application entitled "Proactive Detection of Metal Whiskers in Computer Systems," by Ramakrishna C. Dhanekula, Kenny C. Gross, and David K. McElfresh, application Ser. No. 11/985,288, filed 13 Nov. 2007, which is hereby fully incorporated by reference; U.S. patent application entitled "Detecting Counterfeit Electronic Components Using EMI Telemetric Fingerprints," by Kenny C. Gross, Ramakrishna C. Dhanekula, and Andrew J. Lewis, application Ser. No. 11/974,788, filed 16 Oct. 2007, which is hereby fully incorporated by reference; and U.S. patent application entitled "Determining a Total Length for Conductive Whiskers in Computer Systems," by David K. McElfresh, Kenny C. Gross, and Ramakrishna C. Dhanekula, application Ser. No. 12/126,612, filed 23 May 2008, which is hereby fully incorporated by reference.

In one or more embodiments, execution mechanism 102 causes load script 116 to be executed by monitored system 118 during a parameter-detection process. In particular, execution mechanism 102 may execute the load script on one or more processors (e.g., microprocessors, microcontrollers, CPUs, graphics-processing units (GPUs), PLCs, etc.) in monitored system 118. In addition, the parameter-detection process may be performed in parallel with normal operation of monitored system 118. Execution mechanism 102 may be used only during the training phase of the parameter-detection process. As a result, execution mechanism 102 may be idle during the monitoring phase of the parameter-detection process. On the other hand, during the training phase, execution mechanism 102 may cause load script 116 to be executed by monitored system 118. Then, during a subsequent monitoring phase, normal operation of monitored system 118 may be interrupted as execution mechanism 102 causes load script 116 to be executed by monitored system 118. In one or more embodiments, load script 116 is stored on monitored system 118.

In one or more embodiments, load script 116 is executed as a sequence of instructions that produces a load profile that oscillates between specified processor utilization percentages. Alternatively, execution mechanism 102 may execute the load script as a sequence of instructions that produces a customized load profile. In other words, the load script may correspond to a dynamic load script that changes the load on the processor(s) as a function of time.

In one or more embodiments, during the parameter-detection process, the target electromagnetic signal generated within one or more circuits in target area 120 is collected by antennas 122-126. In particular, the target electromagnetic signal may be monitored by each antenna 122-126 as a received target electromagnetic signal. Consequently, antennas 122-126 may provide a set of received target electromagnetic signals obtained from a variety of directions and/or locations relative to monitored system 118 for analysis.

The received target electromagnetic signal from each antenna 122-126 may be obtained by frequency-analysis mechanism 104 as a received electromagnetic-signal time-series. Frequency-analysis mechanism 104 may also transform each of the received electromagnetic-signal time-series to the frequency-domain. In one or more embodiments, one or more of the received target electromagnetic signals are amplified prior to being transformed into the frequency domain. In one or more embodiments, frequency-analysis mechanism 104 includes a spectrum analyzer. Frequency-analysis mechanism 104 can also include a low-cost demodulator and a low-cost sampler.

Frequency-analysis mechanism 104 is coupled to fingerprint-generation mechanism 106. In one or more embodiments, fingerprint-generation mechanism 106 includes functionality to generate a target electromagnetic-signal fingerprint based on the frequency-domain representation of each received target electromagnetic signal obtained from an antenna 122-126. The target electromagnetic-signal fingerprint may be generated from a set of electromagnetic-signal amplitude-time series associated with a set of well-correlated frequencies from the frequency-domain representations of the received target electromagnetic signals. As described below, the electromagnetic-signal amplitude-time series may be preprocessed to remove ambient-noise in the received target electromagnetic signals prior to generating the electromagnetic-signal fingerprint.

As shown in FIG. 1, the output of fingerprint-generation mechanism 106 is coupled to the inputs of both pattern-recognition mechanism 108 and fingerprint-comparison mechanism 110. In one or more embodiments, pattern-recognition mechanism 108 builds a set of pattern-recognition models associated with the received target electromagnetic signals obtained from antennas 122-126. More specifically, pattern-recognition mechanism 108 creates at least two pattern-recognition models for use in the analysis of the received target electromagnetic signals. The output of one pattern-recognition model may be fed back to fingerprint-generation mechanism for use as input into another pattern-recognition model.

In one or more embodiments, the pattern-recognition models are built using a nonlinear, nonparametric (NLNP) regression technique. In one or more embodiments, the NLNP regression technique corresponds to a multivariate state estimation technique (MSET). The term "MSET" as used in this specification refers to a class of pattern-recognition techniques. For example, see [Gribok] "Use of Kernel Based Techniques for Sensor Validation in Nuclear Power Plants," by Andrei V. Gribok, J. Wesley Hines, and Robert E. Uhrig, *The Third American Nuclear Society International Topical Meeting on Nuclear Plant Instrumentation and Control and Human-Machine Interface Technologies*, Washington D.C., Nov. 13-17, 2000. This paper outlines several different pattern recognition approaches. Hence, the term "MSET" as used in this specification may refer to (among other things) any technique outlined in [Gribok], including ordinary least squares (OLS), support vector machines (SVM), artificial neural networks (ANNs), MSET, or regularized MSET (RM-SET).

In one or more embodiments, pattern-recognition mechanism 108 builds a first pattern-recognition model for reducing ambient-noise in the received target electromagnetic signals. The input to the first pattern-recognition model may correspond to the electromagnetic-signal amplitude-time series for the received target electromagnetic signals obtained from fingerprint-generation mechanism 106. The creation of the first pattern-recognition model is described below with respect to FIG. 2.

In particular, the first pattern-recognition model may be used to calculate a weighted mean of the received target electromagnetic signals. The weighted mean may be used to detune electromagnetic noise found in each of the received target electromagnetic signals. The electromagnetic noise may be generated by electronic systems and/or components in the vicinity of monitored system 118. For example, a target electromagnetic signal monitored from a computer system in a data center may be affected by electromagnetic noise from other computer systems in the data center. Furthermore, the electromagnetic noise may affect the sensitivity of detection module 100 in characterizing monitored system 118. For example, electromagnetic noise may reduce the ability of detection module 100 to detect early degradation, counterfeit components, metal whiskers, faults, and/or subtle anomalies in monitored system 118.

In one or more embodiments, the weighted mean includes a greater contribution from signals with less statistical deviation and/or perturbation (e.g., noise) and less contribution from signals with greater statistical deviation and/or perturbation. Consequently, a set of noise-reduced signals for monitored system 118 may be obtained by subtracting the received target electromagnetic signals from the weighted mean of the received target electromagnetic signals. The noise-reduced signals may then be provided as input into a second pattern-recognition model that is used to assess the integrity of monitored system 118. As mentioned previously, the noise-reduced signals may be used to create a target electromagnetic-signal fingerprint that is fed into the second pattern-recognition model. Pattern-recognition mechanism 108 may then compute an estimated electromagnetic-signal fingerprint from the target electromagnetic-signal fingerprint using the second pattern-recognition model.

Fingerprint-comparison mechanism 110 may compare the target electromagnetic-signal fingerprint generated by fingerprint-generation mechanism 106 to an estimated electromagnetic-signal fingerprint computed by pattern-recognition mechanism 108. The comparison performed by fingerprint-comparison mechanism 110 is described below with respect to FIG. 6. Alarm-generation mechanism 112 may then generate an alarm based on the comparison performed by fingerprint-comparison mechanism 110. In one or more embodiments, information related to the generated alarms is used to characterize monitored system 118 and/or assess the integrity of monitored system 118. Because the comparison is made using noise-reduced signals instead of unmodified received target electromagnetic signals, fingerprint-comparison mechanism 110 and/or alarm-generation mechanism 112 may characterize monitored system 118 and/or detect degradation and anomalies in monitored system 118 with greater accuracy than detection mechanisms that do not utilize such noise-reduced signals.

Figure 2:
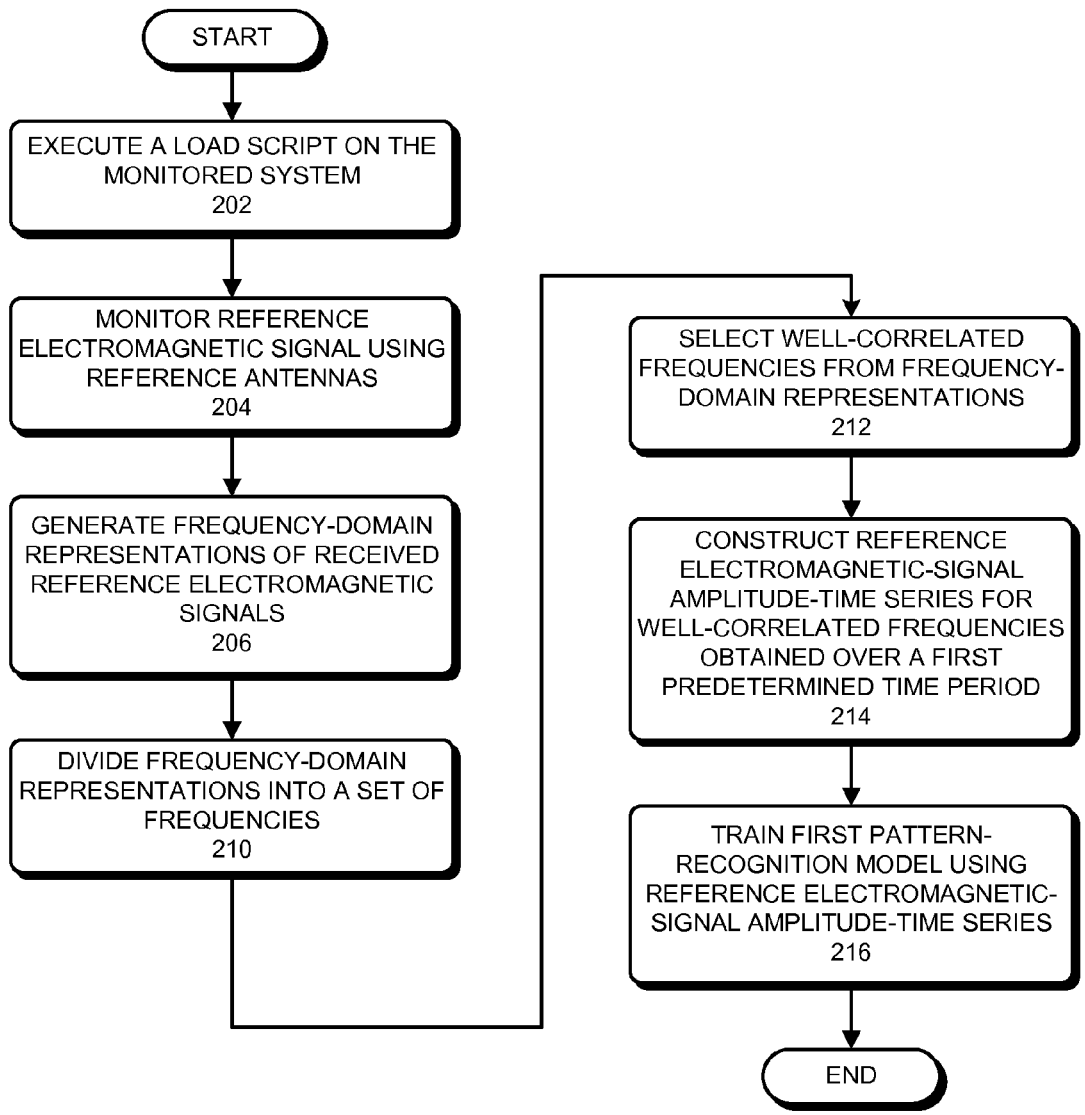
FIG. 2 shows a flowchart illustrating the process of creating a first pattern-recognition model in accordance with an embodiment.

FIG. 2 shows a flowchart illustrating the process of creating a first pattern-recognition model in accordance with an embodiment. In one or more embodiments, one or more of the steps may be omitted, repeated, and/or performed in a different order. Accordingly, the specific arrangement of steps shown in FIG. 2 should not be construed as limiting the scope of the technique.

First, a load script is executed on a monitored system (operation 202). The load script may correspond to a dynamic load script that changes the load on one or more processors in the monitored system as a function of time. As the load script is executed, a reference electromagnetic signal is monitored using a set of reference antennas placed in the vicinity of a reference area within the monitored system (operation 204). The reference electromagnetic signal may be obtained from the monitored system when the monitored system is in a known state. For example, the reference electromagnetic signal may be collected when the monitored system is first manufactured and/or deployed. In other words, the reference electromagnetic signal may be obtained from a "known good" monitored system that does not exhibit degradation or include counterfeit components. Furthermore, the reference area may correspond to a target area (e.g., target area 120 of FIG. 1) of the monitored system in the known state.

The reference antennas may include one or more near-isotropic antennas and/or one or more USB interfaces. Each reference antenna may obtain the reference electromagnetic signal as a received reference electromagnetic signal from the direction toward which the reference antenna faces and/or from the position of the reference antenna relative to the monitored system. More specifically, the reference antenna may obtain the corresponding received reference electromagnetic signal as a reference electromagnetic-signal amplitude-time series. Alternatively, a near-isotropic antenna may be used to obtain multiple received reference electromagnetic signals from the monitored system. For example, the near-isotropic antenna may form an icosahedron such that 20 different received reference electromagnetic signals are obtained by 20 receiving surfaces of the icosahedron.

A set of frequency-domain representations of the received reference electromagnetic signals may then be generated (operation 206). To generate the frequency-domain representations, each reference electromagnetic-signal amplitude-time series is transformed from the time domain to the frequency domain. For example, a fast Fourier transform (FFT) may be used to transform the electromagnetic-signal amplitude-time series from the time domain to the frequency domain. Those skilled in the art will appreciate that other transform functions may also be used, including, but not limited to, a Laplace transform, a discrete Fourier transform, a Z-transform, and any other transform technique now known or later developed.

The frequency-domain representations of the reference electromagnetic-signal amplitude-time series are then divided into a set of frequencies (operation 208). In particular, the frequency-domain representations may be divided into a plurality of "bins," and each "bin" is represented with a representative frequency. For example, the frequency range of the reference electromagnetic-signal amplitude-time series may be divided into a number of bins. The frequency bins and associated representative frequencies may also be equally spaced.

A set of well-correlated frequencies is selected from the frequency-domain representations (operation 212) of the reference electromagnetic-signal amplitude-time series. To determine the well-correlated frequencies, cross-correlations may be computed between pairs of reference electromagnetic-signal amplitude-time series associated with pairs of the representative frequencies. An average correlation coefficient may then be computed for each representative frequency. A subset of the representative frequencies with the highest average correlation coefficients may then be ranked and selected.

A reference electromagnetic-signal amplitude-time series is then constructed for each well-correlated frequency based on the reference electromagnetic-signal amplitude-time series collected over a first predetermined time period (operation 214). To generate the time series for each representative frequency, the received reference electromagnetic signal may be sampled at predetermined time intervals (e.g., every second, every minute, etc.). Each pair of electromagnetic signal samples may then be transformed into the frequency domain, and an electromagnetic-signal amplitude-time pair may be subsequently extracted for each representative frequency at each time interval. In this way, a large number of separate electromagnetic-signal amplitude-time series may be generated for the representative frequencies.

Finally, the first pattern-recognition model is trained using some or all of the reference electromagnetic-signal amplitude-time series. In other words, the reference electromagnetic-signal amplitude-time series may be used as training data for the first pattern-recognition model. For example, 30 frequencies from an original set of 600 representative frequencies may be selected to minimize computation costs while retaining detection sensitivity. On the other hand, all of the representative frequencies may be used.

As described above, the first pattern-recognition model may be created using an NLNP regression technique such as MSET. The first pattern-recognition model may use the reference electromagnetic-signal amplitude-time series to learn the patterns of interaction between the different electromagnetic-signal amplitude-time series. Once the first pattern-recognition model is trained, the first pattern-recognition model may generate accurate estimates of the same electromagnetic-signal amplitude-time series. As discussed below, the estimates may be used to calculate a weighted mean of the target electromagnetic signal obtained from the monitored system. The target electromagnetic signal may then be subtracted from the weighted mean to reduce ambient-noise in the target electromagnetic signal.

Figure 3:
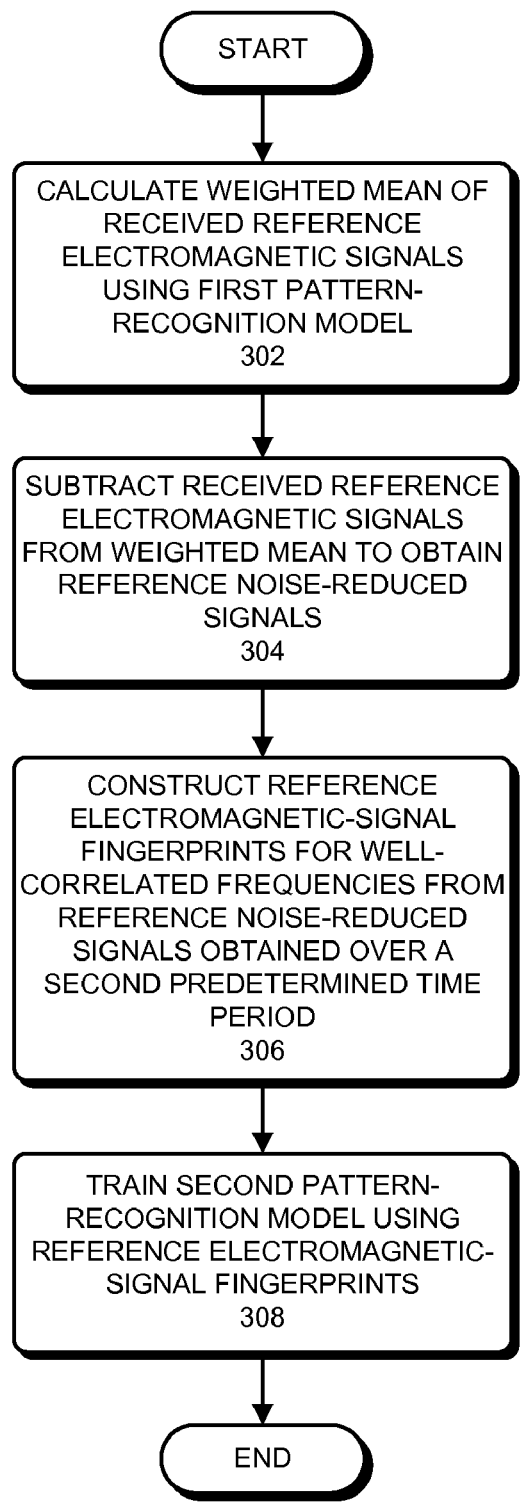
FIG. 3 shows a flowchart illustrating the process of creating a second pattern-recognition model in accordance with an embodiment.

FIG. 3 shows a flowchart illustrating the process of creating a second pattern-recognition model in accordance with an embodiment. In one or more embodiments, one or more of the steps may be omitted, repeated, and/or performed in a different order. Accordingly, the specific arrangement of steps shown in FIG. 3 should not be construed as limiting the scope of the technique.

First, a weighted mean of a set of received reference electromagnetic signals is calculated using the first pattern-recognition model (operation 302). As discussed above, the received reference electromagnetic signals may be obtained from a set of reference antennas. In particular, the reference antennas may continue monitoring the reference electromagnetic signal from the monitored system after the first pattern-recognition model for the monitored system is built. For example, the reference antennas may monitor the reference electromagnetic signals during the execution of another load script on the monitored system and/or during normal operation of the monitored system. The weighted mean of the received reference electromagnetic signals may be used to determine the level of electromagnetic ambient-noise present in each of the received reference electromagnetic signals by including higher contributions from signals with less electromagnetic noise than signals with more electromagnetic noise. The weighted mean may then be subtracted from the received reference electromagnetic signals to obtain a set of reference noise-reduced signals (operation 304).

Next, a set of reference electromagnetic-signal fingerprints is constructed for the well-correlated frequencies from the reference noise-reduced signals obtained over a second predetermined time period (operation 306). The reference electromagnetic-signal fingerprints may include some or all of the well-correlated frequencies identified with respect to FIG. 2. The second pattern-recognition model is then trained using the reference electromagnetic-signal fingerprints (operation 308). As with the first pattern-recognition model, the second pattern-recognition model may be created using MSET and/or another NLNP regression technique and may be trained using a similar method as that of the first pattern-recognition model.

Subsequent input to the second pattern-recognition model may correspond to noise-reduced signals obtained using the first pattern-recognition model. As described below with respect to FIGS. 6-7, the second pattern-recognition model may be used to assess the integrity of the monitored system by computing estimates of the noise-reduced signals and enabling detection of statistical deviations in the noise-reduced signals.

Figure 4:
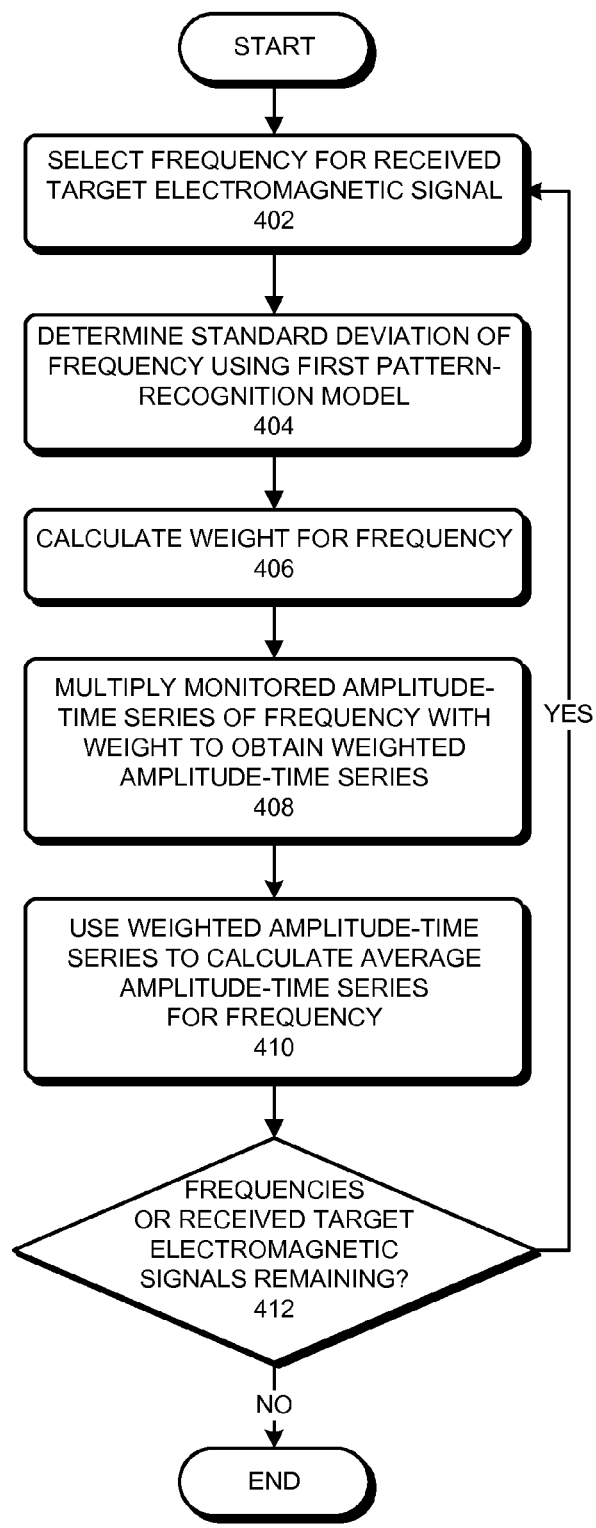
FIG. 4 shows a flowchart illustrating the process of calculating a weighted mean of received target electromagnetic signals in accordance with an embodiment.

FIG. 4 shows a flowchart illustrating the process of calculating a weighted mean of received target electromagnetic signals in accordance with an embodiment. In one or more embodiments, one or more of the steps may be omitted, repeated, and/or performed in a different order. Accordingly, the specific arrangement of steps shown in FIG. 4 should not be construed as limiting the scope of the technique.

First, a frequency for a received target electromagnetic signal may be selected (operation 402). The frequency may be included in a set of representative and/or well-correlated frequencies from the received target electromagnetic signal. Next, a standard deviation of the frequency is determined using the first pattern-recognition model (operation 404). The standard deviation may be calculated from a residual signal obtained from the target electromagnetic signal using the first pattern-recognition model. The residual signal may be obtained by computing an estimate of the received target electromagnetic signal using the first pattern-recognition model (e.g., an MSET model) and subtracting the received target electromagnetic signal from the estimate. The standard deviation may then be calculated as the standard deviation (e.g., fluctuation) of the residual signal obtained over a time period. As a result, the standard deviation may represent the level of ambient-noise present in the received target electromagnetic signal.

A weight for the frequency is then calculated (operation 406). In one or more embodiments, the weight is inversely proportional to the standard deviation. Next, a monitored amplitude-time series for the frequency is multiplied by the weight to obtain a weighted amplitude-time series (operation 408) for the frequency. The monitored amplitude-time series may be obtained as the frequency-domain representation of the received target electromagnetic signal collected over time for the frequency. Furthermore, multiplying the monitored amplitude-time series by the weight may allow portions of the target electromagnetic signals with less ambient-noise (e.g., a smaller standard deviation) to contribute more to an average amplitude-time series for the frequency that is calculated from the weighted amplitude-time series (operation 410) than portions with more ambient-noise.

Operations 402-410 may be repeated for remaining frequencies and/or received target electromagnetic signals (operation 412) used to assess the integrity of the monitored system. For example, operations 402-410 may be used to calculate an average amplitude-time series for every frequency of every received target electromagnetic signal used in a target electromagnetic-signal fingerprint by the second pattern recognition model.

The flowchart of FIG. 4 may also be used to calculate weighted means of received reference electromagnetic signals. As mentioned previously, the weighted means of the received reference electromagnetic signals may then be used to calculated reference noise-reduced signals that are used to train the second pattern-recognition model.

In one or more embodiments, the weight for each frequency is calculated as the inverse of the standard deviation of the frequency divided by the sum of all inverses of standard deviations from all received target electromagnetic signals for the frequency. In other words, the weight may correspond to a proportional contribution by the corresponding received target electromagnetic signal to the average amplitude-time series that is based on the standard deviation of the received target electromagnetic signal for the frequency. The average amplitude-time series may thus be obtained as the sum of the weighted amplitude-time series obtained from the received target electromagnetic signals for the frequency. For example, three received target electromagnetic signals may have standard deviations of 1, 1, and 2, respectively, for a given frequency. The weights of the received target electromagnetic signals may be calculated such that the first two received target electromagnetic signals each contribute 25% and the last received target electromagnetic signal contributes 50% to the average amplitude-time series for the frequency.

Consequently, operations 402-404 may be performed for all received target electromagnetic signals and/or all frequencies before operations 406-410 are performed. More specifically, the standard deviation of a frequency may have to be calculated for each received target electromagnetic signal before the weights can be calculated, because the weights may depend on the standard deviations of all received target electromagnetic signals for the frequency. After the weights are known, the weighted amplitude-time series and average amplitude-time series may be calculated for the frequency and used to reduce ambient-noise in the received target electromagnetic signals.

Figure 5:
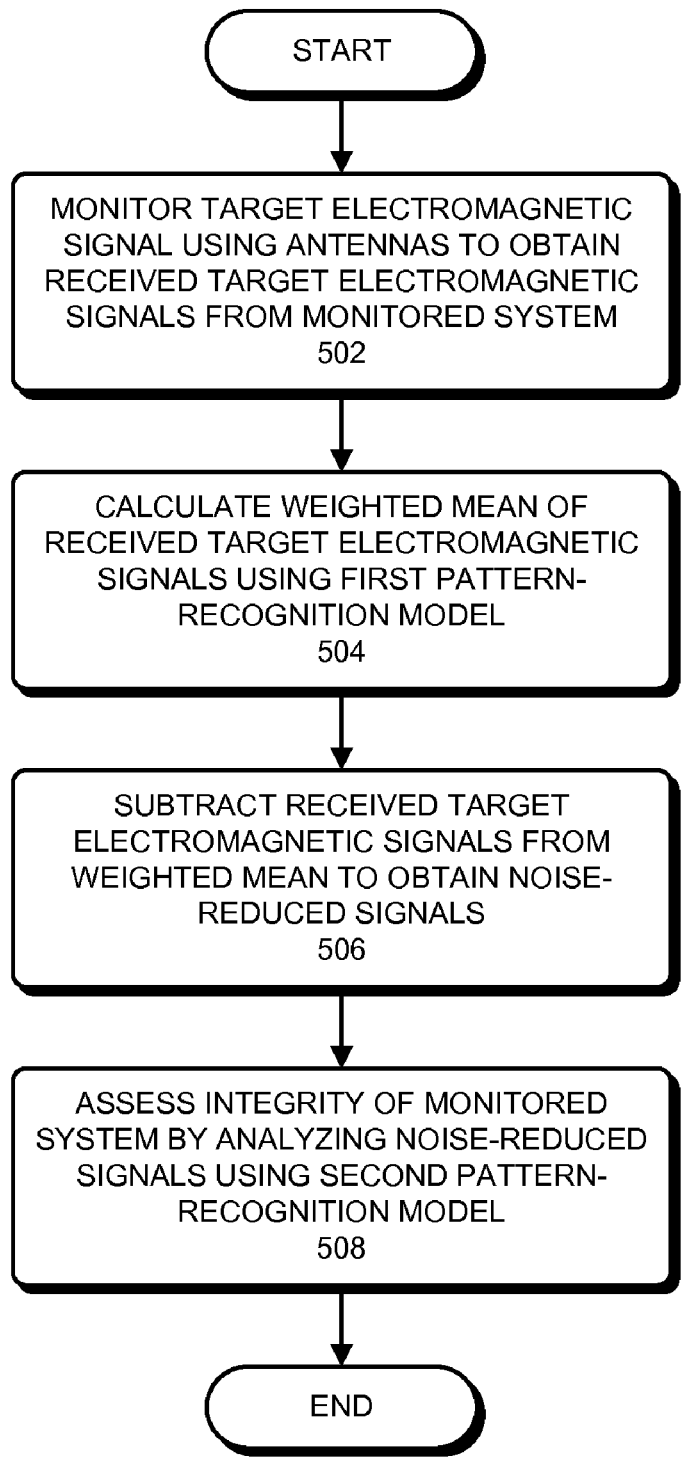
FIG. 5 shows a flowchart illustrating the process of analyzing a target electromagnetic signal radiating from a monitored system in accordance with an embodiment.

FIG. 5 shows a flowchart illustrating the process of analyzing a target electromagnetic signal radiating from a monitored system in accordance with an embodiment. In one or more embodiments, one or more of the steps may be omitted, repeated, and/or performed in a different order. Accordingly, the specific arrangement of steps shown in FIG. 5 should not be construed as limiting the scope of the technique.

To begin the analysis, the target electromagnetic signal is monitored using a set of antennas to obtain a set of received target electromagnetic signals from the monitored system (operation 502). Next, a weighted mean of the received target electromagnetic signals is calculated using a first pattern-recognition model (operation 504), as described above with respect to FIG. 4. The received target electromagnetic signals are then subtracted from the weighted mean to obtain a set of noise-reduced signals (operation 506). Finally, the integrity of the monitored system is assessed by analyzing the noise-reduced signals using the second pattern-recognition model (operation 508), as discussed below with respect to FIG. 7.

Because the noise-reduced signals have a better signal-to-noise ratio than the received target electromagnetic signals, the integrity assessment may be conducted with greater accuracy. For example, analysis of noise-reduced signals may allow for detection of subtle degradation, counterfeit components, metal whiskers, and/or modified chips in the monitored system. (See U.S. patent application Ser. No. 12/126,612, entitled "Determining a Total Length for Conductive Whiskers in Computer Systems," by inventors David K. McElfresh, Kenny C. Gross and Ramakrishna C. Dhanekula, application Ser. No. 12/126,612, filed 23 May 2008, which is hereby incorporated by reference.)

Counterfeit components are components that use packaging, labeling and part numbers that closely match authentic parts, so that the counterfeit parts cannot be easily distinguished from authentic parts through a visual inspection. However, in order for the above-described techniques to work, the internal circuitry of the counterfeit part needs to be different from the authentic part, which leads to a slightly different electronic signature from the authentic part. Note that although a counterfeiter may be able to easily match the packaging and labeling of an authentic component, it may be very hard, if not impossible, for the counterfeiter to manufacture components that produce the same electronic signature as an authentic component.

Consequently, the integrity of the monitored system may be verified with high confidence if no anomalies are detected in the target electromagnetic signals. On the other hand, if anomalies are found in one or more received target electromagnetic signals, the monitored system may be disassembled and/or inspected more closely to determine the source of the anomalies. Noise reduction in the received target electromagnetic signals may thus enable integrity analysis of the monitored system during normal operation of the monitored system (e.g., in a data center), thus facilitating availability and rapid detection of degradation and faults in the monitored system.

Figure 6:
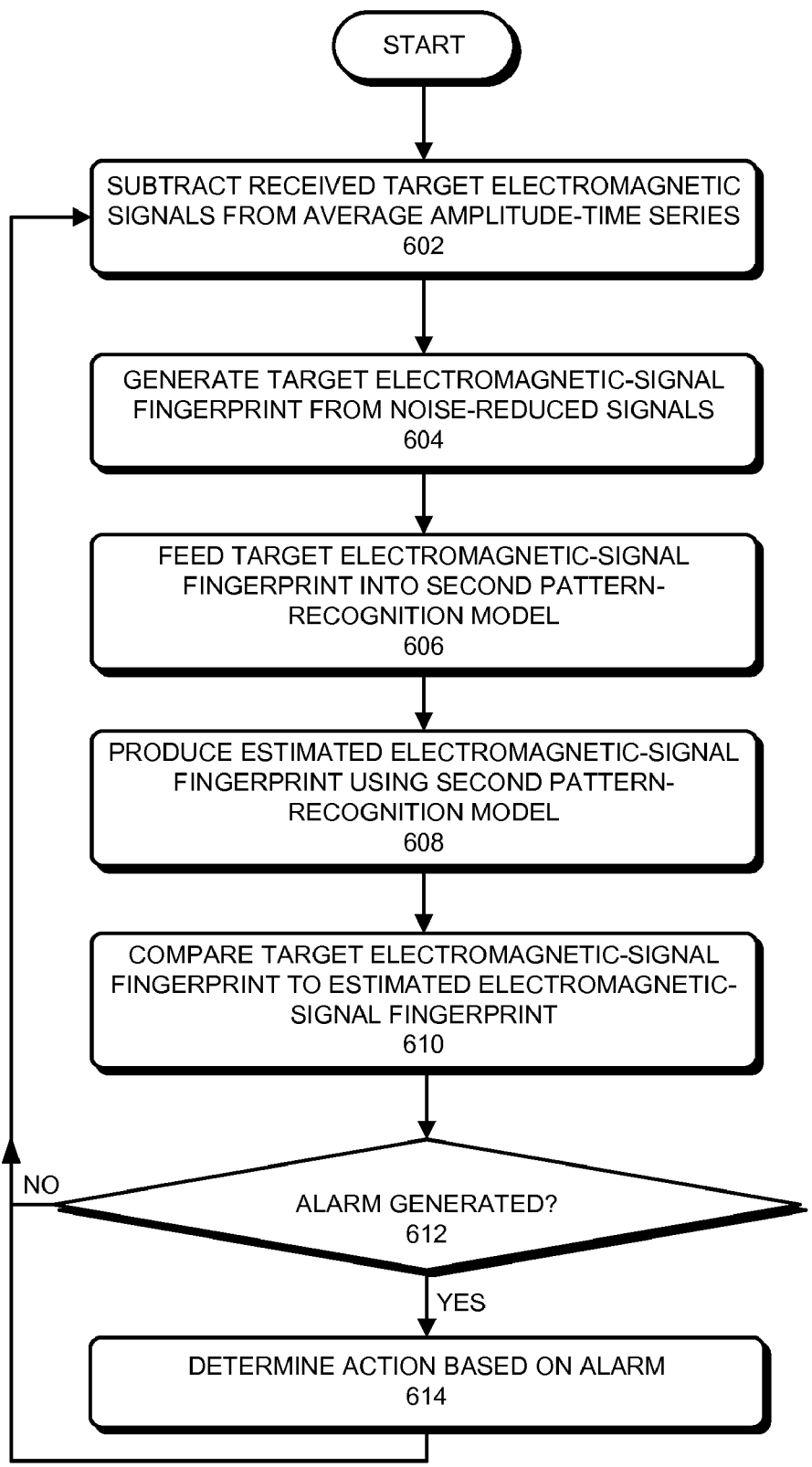
FIG. 6 shows a flowchart illustrating the process of analyzing a set of received target electromagnetic signals in accordance with an embodiment.

FIG. 6 shows a flowchart illustrating the process of analyzing a set of received target electromagnetic signals in accordance with an embodiment. In one or more embodiments, one or more of the steps may be omitted, repeated, and/or performed in a different order. Accordingly, the specific arrangement of steps shown in FIG. 6 should not be construed as limiting the scope of the technique.

Initially, the received target electromagnetic signals are subtracted from a set of average amplitude-time series (operation 602). Each average amplitude-time series may correspond to a weighted mean of the received target electromagnetic signals for a frequency, in which signals with less noise (e.g., standard deviation) may make a greater contribution to the weighted mean. As a result, a set of noise-reduced amplitude-time series for the received target electromagnetic signals may be obtained by subtracting each received target electromagnetic signal from the average amplitude-time series for each frequency.

Next, a target electromagnetic-signal fingerprint is generated from the noise-reduced signals (operation 604). The target electromagnetic-signal fingerprint may be formed from the noise-reduced amplitude-time series obtained for all received target electromagnetic signals in all frequencies used in the first pattern-recognition model. Alternatively, the target electromagnetic-signal fingerprint may include a subset of the frequencies and/or target electromagnetic signals used in the first pattern-recognition model. The target electromagnetic-signal fingerprint is fed as input to the second pattern-recognition (operation 606), and an estimated electromagnetic-signal fingerprint is produced using the second pattern-recognition model (operation 608). The estimated electromagnetic-signal fingerprint may include a set of estimated electromagnetic-signal amplitude-time series corresponding to the set of noise-reduced amplitude-time series in the target electromagnetic-signal fingerprint.

The target electromagnetic-signal fingerprint is then compared to the estimated electromagnetic-signal fingerprint (operation 610), as discussed below with respect to FIG. 7. An alarm may also be generated (operation 612) based on the comparison. For example, an alarm may be generated if the comparison indicates that the target electromagnetic-signal fingerprint is deviating from the estimated electromagnetic-signal fingerprint. This deviation can be quantified by computing residuals (differences) between the target electromagnetic-signal fingerprint and the estimated electromagnetic fingerprint. These residuals can be summed and the sum can be compared to a threshold to determine whether an alarm should be generated. The threshold may be user configurable and/or based on the residuals for one or more "known good" monitored systems associated with the second pattern-recognition model and/or reference electromagnetic-signal fingerprint. If no alarm is generated, operations 602-610 are repeated to continue analyzing the received target electromagnetic signal. If an alarm is generated, an action to be taken is determined based on the alarm (operation 614).

Figure 7:
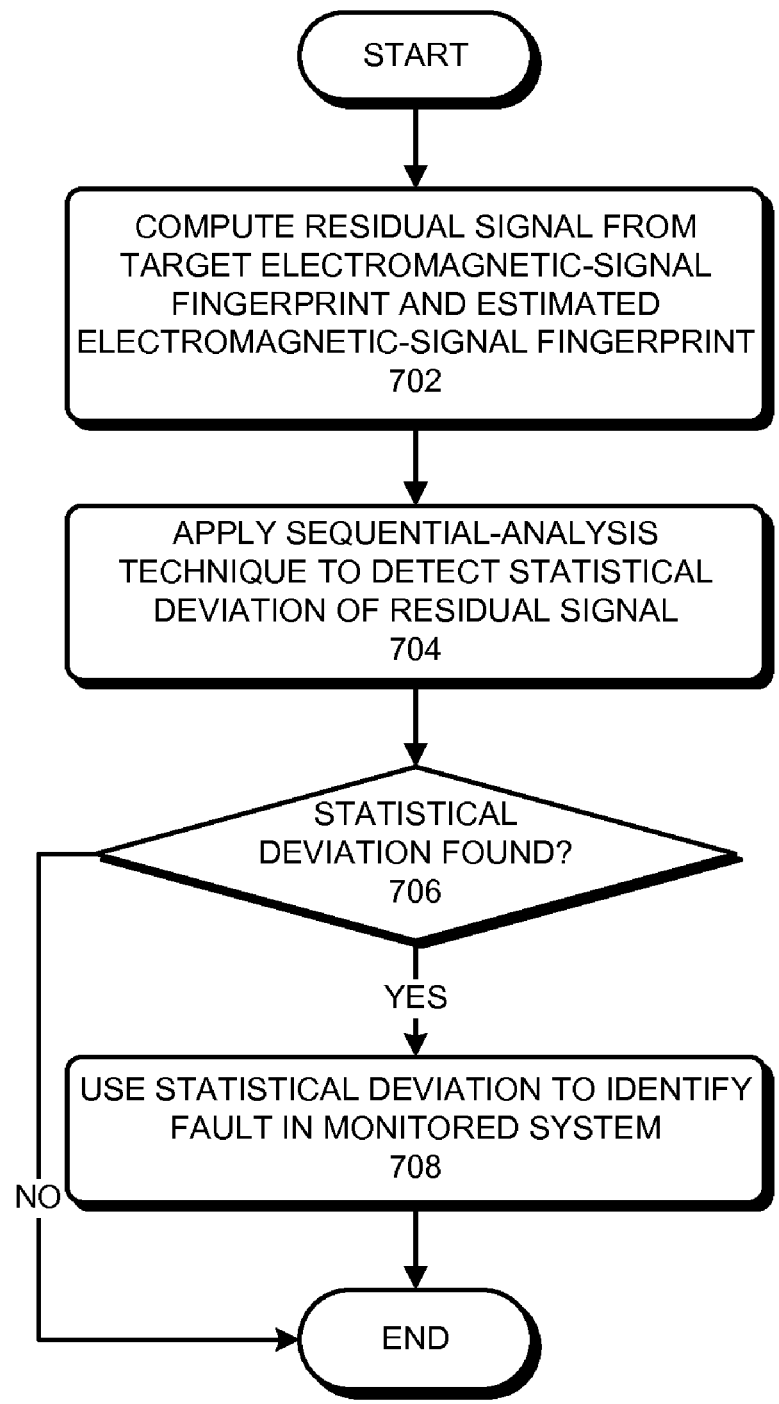
FIG. 7 shows a flowchart illustrating the process of assessing the integrity of a monitored system in accordance with an embodiment.

FIG. 7 shows a flowchart illustrating the process of assessing the integrity of a monitored system in accordance with an embodiment. In one or more embodiments, one or more of the steps may be omitted, repeated, and/or performed in a different order. Accordingly, the specific arrangement of steps shown in FIG. 7 should not be construed as limiting the scope of the technique.

Initially, a residual signal is computed from a target electromagnetic-signal fingerprint and a corresponding estimated electromagnetic-signal fingerprint (operation 702). The residual signal may be computed by taking the difference between the target electromagnetic-signal fingerprint and the estimated electromagnetic-signal fingerprint. Next, a sequential-analysis technique is applied to detect a statistical deviation of the residual signal (operation 704).

In one or more embodiments, the sequential-analysis technique corresponds to a sequential probability ratio test (SPRT). The SPRT may ascertain the existence of a statistical deviation (operation 706) in the residual signal by examining the mean and variance of the residual signal. If the mean and/or variance begin to "drift" from accepted values (e.g., a null hypothesis), a statistical deviation may be found, and the statistical deviation is used to identify a fault in the monitored system (operation 708). For example, the statistical deviation may be used to identify degradation, a modified chip, a counterfeit component, and/or the presence and length of metal whiskers in the monitored system. (For example, see U.S. patent application Ser. No. 12/126,612, entitled "Determining a Total Length for Conductive Whiskers in Computer Systems," by inventors David K. McElfresh, Kenny C. Gross and Ramakrishna C. Dhanekula, application Ser. No. 12/126,612, filed 23 May 2008.) In another example, a chip which has been modified to overcome copyright protection will generate a different electronic signature, which can possibly be detected by the above-described embodiments.

The statistical deviation may also trigger an alarm, such as the alarm in operation 612 of FIG. 6. On the other hand, if the mean and variance of the residual signal are within range of the accepted values and/or in an indifference region associated with the SPRT, no statistical deviation is established and no action is currently required.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method for analyzing a target electromagnetic signal radiating from a monitored system, comprising:
    monitoring the target electromagnetic signal using a set of antennas to obtain a set of received target electromagnetic signals from the monitored system;
    calculating a weighted mean of the received target electromagnetic signals using a first pattern-recognition model;
    subtracting the received target electromagnetic signals from the weighted mean of the received target electromagnetic signals to obtain a set of noise-reduced signals for the monitored system; and
    assessing the integrity of the monitored system by analyzing the noise-reduced signals using a second pattern-recognition model.

2. The method of claim 1, wherein the first pattern-recognition model and second pattern-recognition model are created using a nonlinear, nonparametric regression technique.

3. The method of claim 2, wherein the first pattern-recognition model is created by:
    monitoring a reference electromagnetic signal radiating from the monitored system using a set of reference antennas to obtain a set of received reference electromagnetic signals;
    generating a set of frequency-domain representations of the received reference electromagnetic signals;
    dividing each of the frequency-domain representations of the received reference electromagnetic signals into a set of frequencies;
    selecting a set of well-correlated frequencies from the frequency-domain representations of the received reference electromagnetic signals;
    constructing a set of reference electromagnetic-signal amplitude-time series for each of the well-correlated frequencies based on the received reference electromagnetic signals collected over a first predetermined time period; and
    training the first pattern-recognition model using the reference electromagnetic-signal amplitude-time series.

4. The method of claim 3, wherein the second pattern-recognition model is created by:
    calculating a weighted mean of the received reference electromagnetic signals obtained from the reference antennas using the first pattern-recognition model;
    subtracting the received reference electromagnetic signals from the weighted mean of the received reference electromagnetic signals to obtain a set of reference noise-reduced signals for the monitored system;
    constructing a set of reference electromagnetic-signal fingerprints for each of the well-correlated frequencies from the reference noise-reduced signals obtained over a second predetermined time period; and
    training the second pattern-recognition model using the reference electromagnetic-signal fingerprints.

5. The method of claim 4, wherein calculating the weighted mean of the received target electromagnetic signals involves:
    for each frequency from the frequencies of each of the received target electromagnetic signals:
        determining a standard deviation of the frequency using the first pattern-recognition model;
        calculating a weight for the frequency, wherein the weight is inversely proportional to the standard deviation of the frequency;
        multiplying a monitored amplitude-time series of the frequency with the weight to obtain a weighted amplitude-time series for the frequency; and
        using the weighted amplitude-time series to calculate an average amplitude-time series for the frequency.

6. The method of claim 5, wherein obtaining the noise-reduced signals for the monitored system involves:
    for each frequency from the frequencies of each of the received target electromagnetic signals:
        subtracting the received target electromagnetic signals from the average amplitude-time series to obtain a noise-reduced amplitude-time series.

7. The method of claim 1, wherein analyzing the noise-reduced signals using the second pattern-recognition model involves:
    generating a target electromagnetic-signal fingerprint from the noise-reduced signals;
    feeding the target electromagnetic-signal fingerprint into the second pattern-recognition model;

producing an estimated electromagnetic-signal fingerprint using the second pattern-recognition model; and comparing the target electromagnetic-signal fingerprint to the estimated electromagnetic-signal fingerprint to detect a statistical deviation in the noise-reduced signals.

8. The method of claim 7, wherein the statistical deviation is detected using a sequential probability ratio test (SPRT).

9. The method of claim 1, wherein the antennas include at least one of a near-isotropic antenna and a Universal Serial Bus (USB) interface.

10. A system for analyzing a target electromagnetic signal radiating from a monitored system, comprising:
 a set of antennas configured to monitor the target electromagnetic signal to obtain a set of received target electromagnetic signals from the monitored system; and
 an analysis apparatus configured to:
  calculate a weighted mean of the received target electromagnetic signals using a first pattern-recognition model;
  subtract the received target electromagnetic signals from the weighted mean of the received target electromagnetic signals to obtain a set of noise-reduced signals for the monitored system; and
  assess the integrity of the monitored system by analyzing the noise-reduced signals using a second pattern-recognition model.

11. The system of claim 10, wherein the first pattern-recognition model is created by:
 monitoring a reference electromagnetic signal radiating from the monitored system using a set of reference antennas to obtain a set of received reference electromagnetic signals;
 generating a set of frequency-domain representations of the received reference electromagnetic signals;
 dividing each of the frequency-domain representations of the received reference electromagnetic signals into a set of frequencies;
 selecting a set of well-correlated frequencies from the frequency-domain representations of the received reference electromagnetic signals;
 constructing a set of reference electromagnetic-signal amplitude-time series for each of the well-correlated frequencies based on the received reference electromagnetic signals collected over a first predetermined time period; and
 training the first pattern-recognition model using the reference electromagnetic-signal amplitude-time series.

12. The system of claim 11, wherein the second pattern-recognition model is created by:
 calculating a weighted mean of the received reference electromagnetic signals obtained from the reference antennas using the first pattern-recognition model;
 subtracting the received reference electromagnetic signals from the weighted mean of the received reference electromagnetic signals to obtain a set of reference noise-reduced signals for the monitored system;
 constructing a set of reference noise-reduced amplitude-time series for each of the well-correlated frequencies based on the reference noise-reduced signals obtained over a second predetermined time period; and
 training the second pattern-recognition model using the reference noise-reduced amplitude-time series.

13. The system of claim 12, wherein calculating the weighted mean of the received target electromagnetic signals involves:
 for each frequency from the frequencies of each of the received target electromagnetic signals:
  determining a standard deviation of the frequency using the first pattern-recognition model;
  calculating a weight for the frequency, wherein the weight is inversely proportional to the standard deviation of the frequency;
  multiplying a monitored amplitude-time series of the frequency with the weight to obtain a weighted amplitude-time series for the frequency; and
  using the weighted amplitude-time series to calculate an average amplitude-time series for the frequency.

14. The system of claim 13, wherein obtaining the noise-reduced signals for the monitored system involves:
 for each frequency from the frequencies of each of the received target electromagnetic signals:
 subtracting the average amplitude-time series from the received target electromagnetic signals to obtain a noise-reduced amplitude-time series.

15. The system of claim 10, wherein the antennas include at least one of a near-isotropic antenna and a Universal Serial Bus (USB) interface.

16. The system of claim 10, wherein analyzing the noise-reduced signals using the second pattern-recognition model involves:
 generating a target electromagnetic-signal fingerprint from the noise-reduced signals;
 feeding the target electromagnetic-signal fingerprint into the second pattern-recognition model;
 producing an estimated electromagnetic-signal fingerprint using the second pattern-recognition model; and
 comparing the target electromagnetic-signal fingerprint to the estimated electromagnetic-signal fingerprint to detect a statistical deviation in the noise-reduced signals.

17. A non-transitory computer-readable storage medium storing instructions that when executed by a computer cause the computer to perform a method for analyzing a target electromagnetic signal radiating from a monitored system, the method comprising:
 monitoring the target electromagnetic signal using a set of antennas to obtain a set of received target electromagnetic signals from the monitored system;
 calculating a weighted mean of the received target electromagnetic signals using a first pattern-recognition model;
 subtracting the received target electromagnetic signals from the weighted mean of the received target electromagnetic signals to obtain a set of noise-reduced signals for the monitored system; and
 assessing the integrity of the monitored system by analyzing the noise-reduced signals using a second pattern-recognition model.

18. The non-transitory computer-readable storage medium of claim 17, wherein the first pattern-recognition model is created by:
 monitoring a reference electromagnetic signal radiating from the monitored system using a set of reference antennas to obtain a set of received reference electromagnetic signals;
 generating a set of frequency-domain representations of the received reference electromagnetic signals;
 dividing each of the frequency-domain representations of the received reference electromagnetic signals into a set of frequencies;
 selecting a set of well-correlated frequencies from the frequency-domain representations of the received reference electromagnetic signals;
 constructing a set of reference electromagnetic-signal amplitude-time series for each of the well-correlated frequencies based on the received reference electromagnetic signals collected over a first predetermined time period; and training the first pattern-recognition model using the reference electromagnetic-signal amplitude-time series.

19. The non-transitory computer-readable storage medium of claim 18, wherein the second pattern-recognition model is created by:

calculating a weighted mean of the received reference electromagnetic signals obtained from the reference antennas using the first pattern-recognition model;

subtracting the received reference electromagnetic signals from the weighted mean of the received reference electromagnetic signals to obtain a set of reference noise-reduced signals for the monitored system;

constructing a set of reference residual amplitude-time series for each of the well-correlated frequencies based on the reference noise-reduced signals obtained over a second predetermined time period; and training the second pattern-recognition model using the reference residual amplitude-time series.

20. The non-transitory computer-readable storage medium of claim 19, wherein calculating the weighted mean of the received target electromagnetic signals involves:

for each frequency from the frequencies of each of the received target electromagnetic signals:

determining a standard deviation of the frequency using the first pattern-recognition model;

calculating a weight for the frequency, wherein the weight is inversely proportional to the standard deviation of the frequency;

multiplying a monitored amplitude-time series of the frequency with the weight to obtain a weighted amplitude-time series for the frequency; and using the weighted amplitude-time series to calculate an average amplitude-time series for the frequency.

* * * * *